(12) United States Patent
Khanolkar

(10) Patent No.: US 12,176,285 B2
(45) Date of Patent: Dec. 24, 2024

(54) TRANSFORMER GUARD TRACE

(71) Applicant: Texas Instruments Incorporated, Dallas, TX (US)

(72) Inventor: Vijaylaxmi Gumaste Khanolkar, Pune (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1145 days.

(21) Appl. No.: 16/750,225

(22) Filed: Jan. 23, 2020

(65) Prior Publication Data

US 2020/0211961 A1    Jul. 2, 2020

Related U.S. Application Data

(63) Continuation-in-part of application No. 16/236,730, filed on Dec. 31, 2018, now Pat. No. 11,482,477.

(30) Foreign Application Priority Data

Feb. 1, 2019    (IN) .............................. 201941004011

(51) Int. Cl.
*H01L 23/495*    (2006.01)
*H01F 17/00*    (2006.01)
(Continued)

(52) U.S. Cl.
CPC ..... *H01L 23/5227* (2013.01); *H01F 17/0006* (2013.01); *H01F 27/2804* (2013.01);
(Continued)

(58) Field of Classification Search
CPC ............ H01L 23/5227; H01L 27/2804; H01L 27/288; H01L 41/041; H01L 23/495;
(Continued)

(56) References Cited

U.S. PATENT DOCUMENTS 5,312,674 A    5/1994    Haertling et al.
5,420,558 A    5/1995    Ito et al.
(Continued)

OTHER PUBLICATIONS

Park et al., "Ferrite-Based Integrated Planar Inductors and Transformers Fabricated at Low Temperatures", IEEE Transactions on Magnetics, vol. 33, No. 5, Sep. 1997, 3 pages.
(Continued)

*Primary Examiner* — Caleb E Henry
*Assistant Examiner* — Dilinh P Nguyen
(74) *Attorney, Agent, or Firm* — Ronald O. Neerings; Frank D. Cimino

(57) ABSTRACT

An electronic device includes first leads along a first side, second leads along a second side, first and second dies, and a magnetic assembly with a multilevel lamination structure with first and second windings and a conductive guard trace. The lamination structure includes the first winding in a first level, and the second winding in a different level. The guard trace is between the first patterned conductive feature and the second side of the package structure. A first set of electrical connections couple the first die, the first winding, and one of the first conductive leads in a first circuit, and a second set of electrical connections couple the second die, the second winding, the guard trace and one of the second conductive leads in an isolated second circuit.

29 Claims, 10 Drawing Sheets

(51) Int. Cl.
    H01F 27/28      (2006.01)
    H01F 41/04      (2006.01)
    H01L 23/00      (2006.01)
    H01L 23/522     (2006.01)
    H05K 3/46       (2006.01)

(52) U.S. Cl.
    CPC ......... *H01F 27/288* (2013.01); *H01F 41/041* (2013.01); *H01L 23/495* (2013.01); *H01L 24/32* (2013.01); *H01L 24/48* (2013.01); *H05K 3/4611* (2013.01); *H01L 2224/32188* (2013.01); *H01L 2224/48091* (2013.01); *H01L 2224/73265* (2013.01); *H01L 2924/1517* (2013.01)

(58) Field of Classification Search
    CPC . H01L 2224/32188; H01L 2224/73565; H01L 2924/1517
    USPC ........................................................ 257/676
    See application file for complete search history.

(56) References Cited

U.S. PATENT DOCUMENTS

| | | | |
|---|---|---|---|
| 2003/0020583 A1* | 1/2003 | Hui | H01F 27/36 336/200 |
| 2005/0128038 A1* | 6/2005 | Hyvonen | H01L 23/5225 336/182 |
| 2009/0243782 A1 | 10/2009 | Fouquet et al. | |
| 2010/0148911 A1 | 6/2010 | Fouquet et al. | |
| 2010/0259909 A1 | 10/2010 | Ho et al. | |
| 2010/0265030 A1 | 10/2010 | Weekamp et al. | |
| 2011/0057291 A1 | 3/2011 | Slupsky et al. | |
| 2011/0095620 A1 | 4/2011 | Fouquet et al. | |
| 2012/0020419 A1 | 1/2012 | Kaeriyama | |
| 2012/0168901 A1 | 7/2012 | Santangelo et al. | |
| 2013/0043970 A1 | 2/2013 | Poddar et al. | |
| 2013/0082812 A1 | 4/2013 | Yoo et al. | |
| 2014/0252533 A1 | 9/2014 | O'Sullivan | |
| 2015/0069572 A1* | 3/2015 | Khanolkar | H01L 28/10 257/531 |
| 2015/0108603 A1 | 4/2015 | Yen et al. | |
| 2015/0115402 A1 | 4/2015 | Yen et al. | |
| 2015/0280785 A1* | 10/2015 | Brauchler | H04B 5/005 438/3 |
| 2016/0069662 A1 | 3/2016 | Mullenix et al. | |
| 2017/0059364 A1 | 3/2017 | Mullenix | |
| 2017/0178787 A1 | 6/2017 | Massolini et al. | |
| 2017/0194088 A1 | 7/2017 | Massolini et al. | |
| 2018/0190573 A1 | 7/2018 | Mullenix et al. | |

OTHER PUBLICATIONS

Brandon et al., "Printed Microinductors on Flexible Substrates for Power Applications", IEEE Transactions on Components and Packaging Technologies, vol. 26, No. 3, Sep. 2003, 7 pages.

Ouyang, Z. and M. Andersen "Overview of Planar Magnetic Technology—Fundamental Properties." vol. 29, No. 9, Sep. 2014, IEEE Transactions on Power Electronics: 4888-4900.

Chen, Baoxing et al., "High Speed Digital Isolators Using Microscale On-Chip Transformers", 72203-12709274, Non_Patent_Literature, May 18, 2010 (Year: 2010).

Bang, D.H., and J.Y. Park. "Ni—Zn Ferrite Screen Printed Power Inductors for Compact DC-DC Power Converter Applications." vol. 45, No. 6, Jun. 2009, IEEE Transactions on Magnetics: 2762-65.

Hurley, W.G., M.C. Duffy, S. O'Reilly, and S.C. O'Mathuna. "Impedance Formulas for Planar Magnetic Structures with Spiral Windings." vol. 46, No. 2, Apr. 2009, IEEE Transactions on Industrial Electronics: 271-78.

Lu, Junwei, and F. Dawson. "Characterizations of High Frequency Planar Transformer With a Novel Comb-Shaped Shield." vol. 47, No. 10, Oct. 2011, IEEE Transactions on Magnetics: 4493-496.

Liu, X., and S.Y.R. Hui. "An Analysis of a Double-layer Electromagnetic Shield for a Universal Contactless Battery Charging Platform." IEEE 36th Conference on Power Electronics Specialists, 2005, pp. 1767-1772.

Roshen, W.A. "Analysis of Planar Sandwich Inductors by Current Images." vol. 26, No. 5, Sep. 1990, IEEE Transactions on Magnetics: 2880-87.

Tang, S.C., S. Y. Ron Hui and H. Shu-Hung Chung. "Evaluation of the Shielding Effects on Printed-Circuit-Board Transformers Using Ferrite Plates and Copper Sheets." vol. 17, No. 6, Nov. 2002, IEEE Transactions on Power Electronics: 1080-88.

Tang, S.C., S.Y. Ron Hui, and Henry Shu-Hung Chung. "A Low Profile Power Converter Using Printed-Circuit Board (PCB Power Transformer with Ferrite Polymer Composite." vol. 16, No. 4, Jul. 2001, IEEE Transactions on Power Electronics: 493-498.

* cited by examiner

TRANSFORMER GUARD TRACE

CROSS-REFERENCE TO RELATED APPLICATIONS

This application is a continuation-in-part of U.S. patent application Ser. No. 16/236,730, filed Dec. 31, 2018, entitled "PACKAGED ELECTRONIC DEVICE WITH SUSPENDED MAGNETIC SUBASSEMBLY", the entirety of which application is are hereby incorporated by reference. Under 35 U.S.C. § 119, this application claims priority to, and the benefit of, Indian provisional application number 201941004011, entitled "Isolated transformer with guard trace to reduce electrostatic fields", and filed in India on Feb. 1, 2019, the entirety of which is hereby incorporated by reference.

BACKGROUND

Integrated isolated power products are packaged electronic devices having semiconductor dies and integrated transformers with electrical connections to externally accessible leads (e.g., pins or pads) for soldering to a printed circuit board (PCB). Transformer or inductor coils can be fabricated in a lamination structure for integration in a packaged electronic device. High voltage isolation is sometimes used for isolated power transformer applications, and certain product design specifications call for high voltage withstanding performance (e.g., above 5 kV rms). High electrostatic field strength metal structures of the device belonging to opposite high voltage potential nodes can lead to arcing at external pins during testing. For example, certain leads of the electronic device and a transformer winding in a laminated magnetic structure may be coupled to a high voltage primary circuit of an isolated power converter, while other leads are coupled to a low voltage secondary circuit. Electrostatic fields from a transformer coil of a first voltage domain in the laminated magnetic structure link with the package leads of a second voltage domain and cause high electric fields on the package pins, sometimes leading to external arcing. Excessive voltage differentials between the primary and secondary can cause external arcing at the leads during manufacturing testing. Increasing the spacing between the laminate transformer coils and the package leads or providing asymmetrical die attach pads can mitigate arcing, but this approach reduces the allowable transformer size and degrades product efficiency and functional performance. In addition, each design has different specifications with respect to electric fields, efficiency and electromagnetic interference (EMI) performance.

SUMMARY

In accordance with one aspect, a packaged electronic device includes first conductive leads along a first side of a package structure and second conductive leads along a second side of the package structure, as well as a first semiconductor die attached to a first die attach pad, and a second semiconductor die attached to a second die attach pad. The packaged electronic device includes a magnetic assembly having a multilevel lamination structure that includes first and second patterned conductive features to form respective first and second windings. The first patterned conductive feature has multiple turns in a first level to form the first winding, and the second patterned conductive feature has multiple turns in a different level to form the second winding. The multilevel lamination structure also includes a conductive guard trace spaced apart from and between the first patterned conductive feature and the second side of the package structure. The magnetic assembly further includes first and second core structures attached to respective first and second sides of the lamination structure. The packaged electronic device also includes a first set of electrical connections that couple the first semiconductor die, the first patterned conductive feature, and at least one of the first conductive leads in a first circuit, and a second set of electrical connections that couple the second semiconductor die, the second patterned conductive feature, the conductive guard trace, and at least one of the second conductive leads in a second circuit isolated from the first circuit.

In one example, the multilevel lamination structure includes a first conductive shield trace having multiple turns in a second level between the first patterned conductive feature and the second patterned conductive feature, where the first set of electrical connections couple the first conductive shield trace to the first circuit. In one implementation, the conductive guard trace is in the second level of the multilevel lamination structure. In another implementation, the conductive guard trace is in at least one of the first level and the second level. In certain examples, the multilevel lamination structure includes a second conductive shield trace having multiple turns in another level between the first and second patterned conductive features, and the second conductive shield trace is coupled to the conductive guard trace in the second circuit. In one example, the first and second sides of the package structure are spaced apart from one another along a first direction, an outermost turn of the first patterned conductive feature has a first length along a second direction perpendicular to the first direction, and the conductive guard trace has a second length along the second direction, where the second length is greater than the first length.

In accordance with another aspect, a magnetic assembly has a multilevel lamination structure that includes a first side, a second side spaced apart from the first side along a first direction, a third side, and a fourth side spaced apart from the third side along a second direction perpendicular to the first direction. The multilevel lamination structure also includes a first patterned conductive feature having multiple turns in a first level to form a first winding, a second patterned conductive feature having multiple turns in a different level to form a second winding, and a conductive guard trace spaced apart from and between the first patterned conductive feature and the second side of the multilevel lamination structure. The magnetic assembly also includes a first core structure attached to a first side of the lamination structure, and a second core structure attached to a second side of the lamination structure.

In one example, the multilevel lamination structure includes a first conductive shield trace with multiple turns in a second level between the first and second patterned conductive features. In one implementation, the conductive guard trace is in the second level. In one example, the conductive guard trace is in at least one of the first level and the second level. In certain examples, the multilevel lamination structure includes a second conductive shield trace with multiple turns in another level between the first and second patterned conductive features. In one example, an outermost turn of the first patterned conductive feature has a first length along the second direction, and the conductive guard trace has a second length along the second direction, where the second length is greater than the first length.

In accordance with another aspect, a method for fabricating an electronic device includes attaching a magnetic assembly to a support structure with a first side of a multilevel lamination structure facing first conductive leads, a second side of the multilevel lamination structure facing second conductive leads, and a conductive guard trace of the multilevel lamination structure spaced apart from and between a first winding of the multilevel lamination structure and the second conductive leads. The method further includes attaching a first semiconductor die to a first die attach pad and attaching a second semiconductor die to a second die attach pad. In addition, the method includes performing an electrical connection process that couples the first semiconductor die, the first winding of the magnetic assembly, and at least one of the first conductive leads in a first circuit. The electrical connection also couples the second semiconductor die, a second winding of the magnetic assembly, the conductive guard trace, and at least one of the second conductive leads in a second circuit isolated from the first circuit. The method further includes performing a molding process that encloses the magnetic assembly, the die attach pads, the semiconductor dies, portions of the first and second conductive leads in a package structure.

In one example, the electrical connection process couples a first conductive shield trace of the multilevel lamination structure to the first circuit. In one example, the wire bonding process couples a second conductive shield trace of the multilevel lamination structure to the second circuit. In one example, the electrical connection process couples the conductive guard trace to the second conductive shield trace of the multilevel lamination structure.

DETAILED DESCRIPTION

Figure 1:
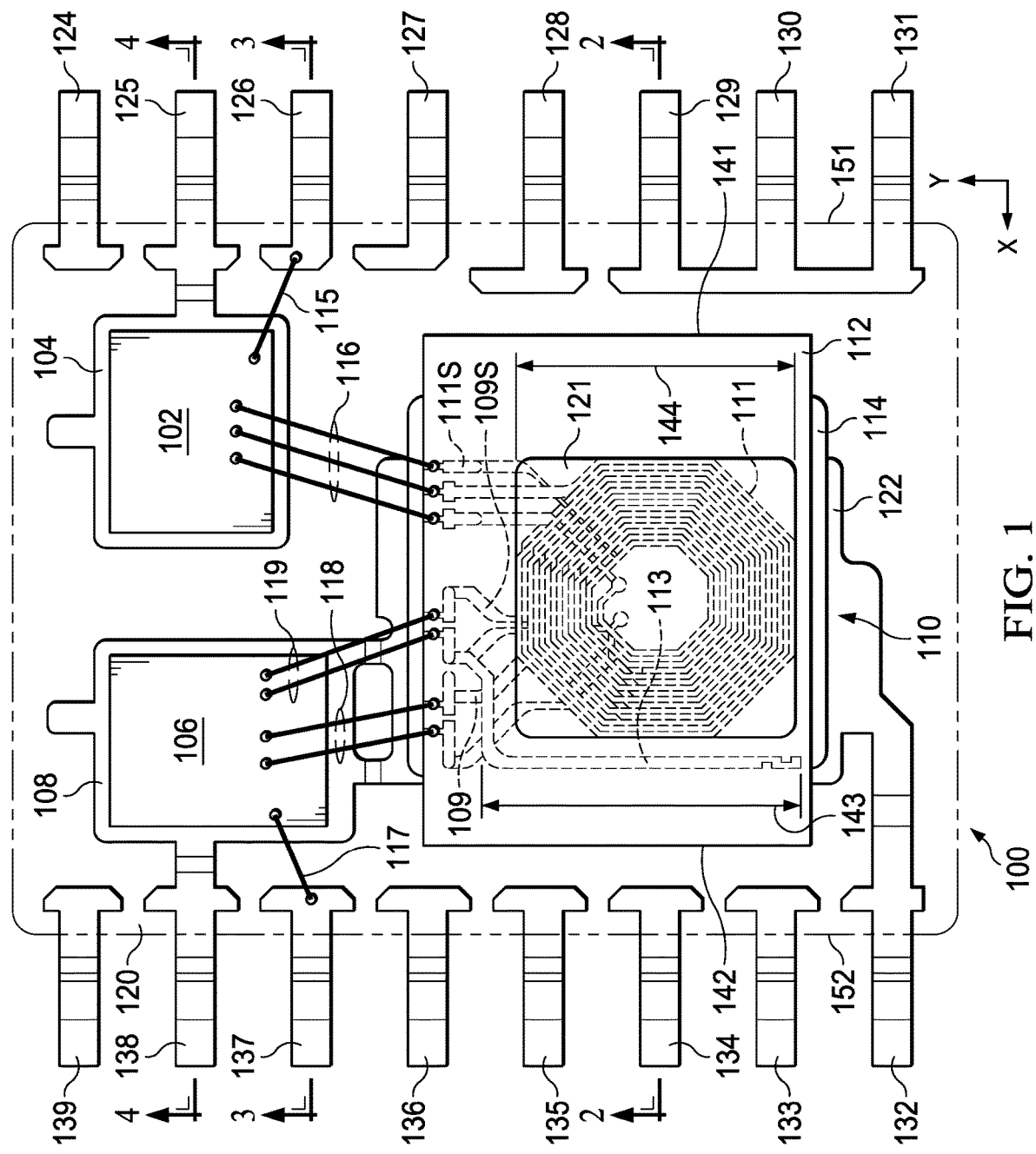
FIG. 1 is a bottom view of a packaged electronic device that includes a magnetic assembly having a conductive guard trace.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIGS. 1-6 show an example packaged electronic device 100 with a laminated magnetic assembly having a guard trace between a winding of a first voltage domain and leads of a second voltage domain. The guard trace helps keep high electric fields within the high dielectric laminations between the first winding and the guard trace, instead of extending to the second voltage domain leads through lower dielectric molding compound material and/or air. The guard trace solution can be used in products having symmetric or asymmetric magnetic assembly positioning, and provides a scalable solution to accommodate designs with differing electric field, efficiency and/or EMI performance specifications. The guard trace solution can be used with a magnetic assembly mounted with a semiconductor die to a shared die attach pad as shown in FIGS. 1-6, or the magnetic assembly can be separately supported on a conductive support structure spaced apart from integrated semiconductor dies and associated conductive die attach pads. The guard trace or traces in the illustrated examples contain the high electric field lines within the lamination structure. Guard traces can be provided in one or more layers or levels of the multilevel lamination structure, and operate to reduce the overall internal field strength and limit external fields within desired design specifications to eliminate or mitigate external arcing and enhance final test device yield for integrated isolated power products and other packaged electronic devices.

Figure 2:
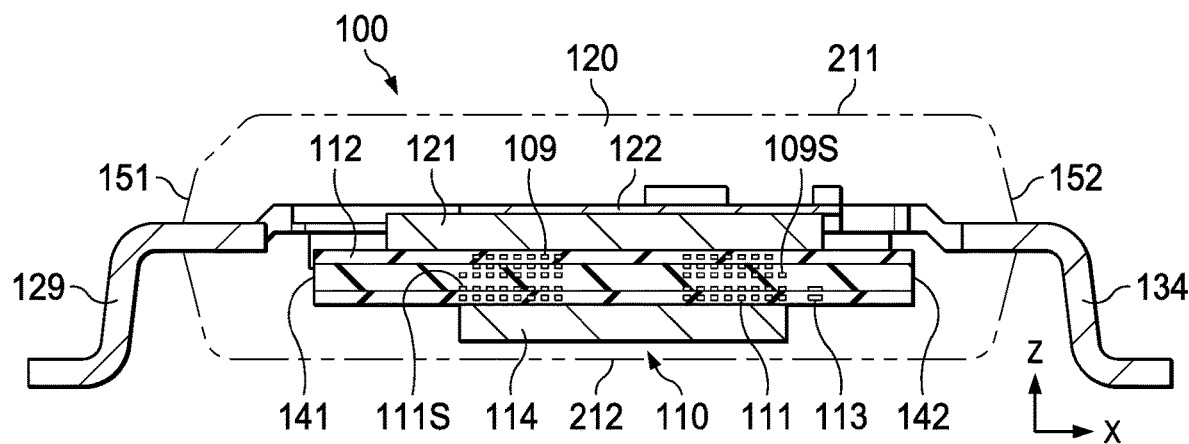
FIG. 2 is a partial sectional end view of the packaged electronic device taken along line 2-2 of FIG. 1.
Figure 3:
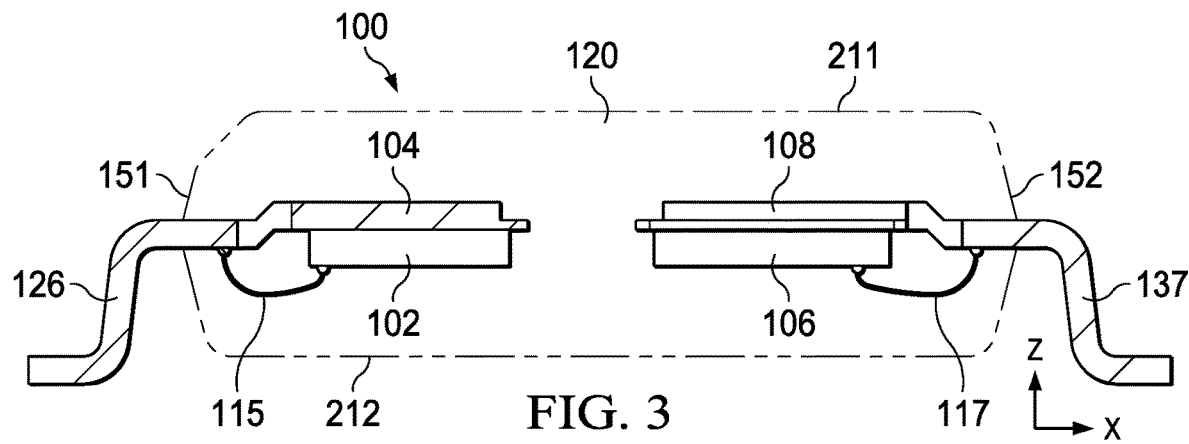
FIG. 3 is a partial sectional end elevation view of the packaged electronic device taken along line 3-3 of FIG. 1.
Figure 4:
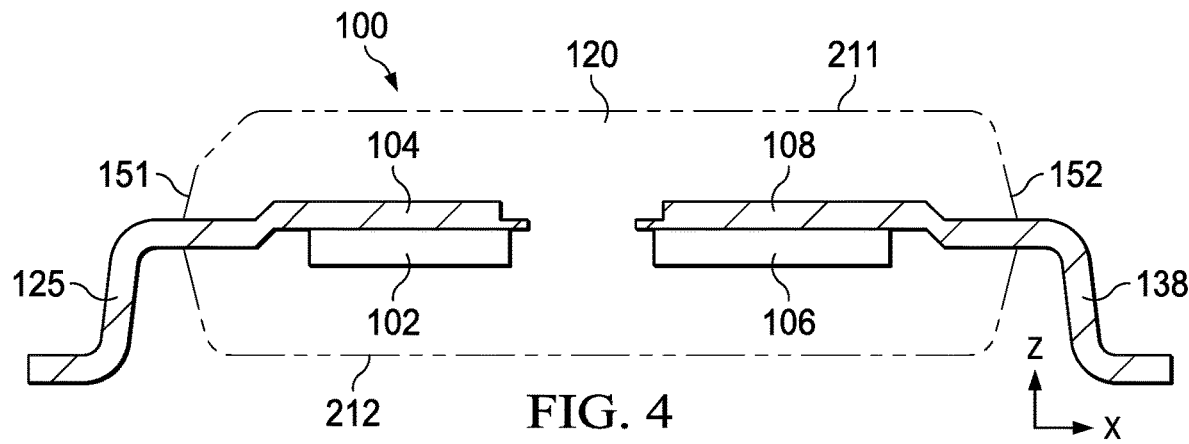
FIG. 4 is a partial sectional end view of the packaged electronic device taken along line 4-4 of FIG. 1.
Figure 5:
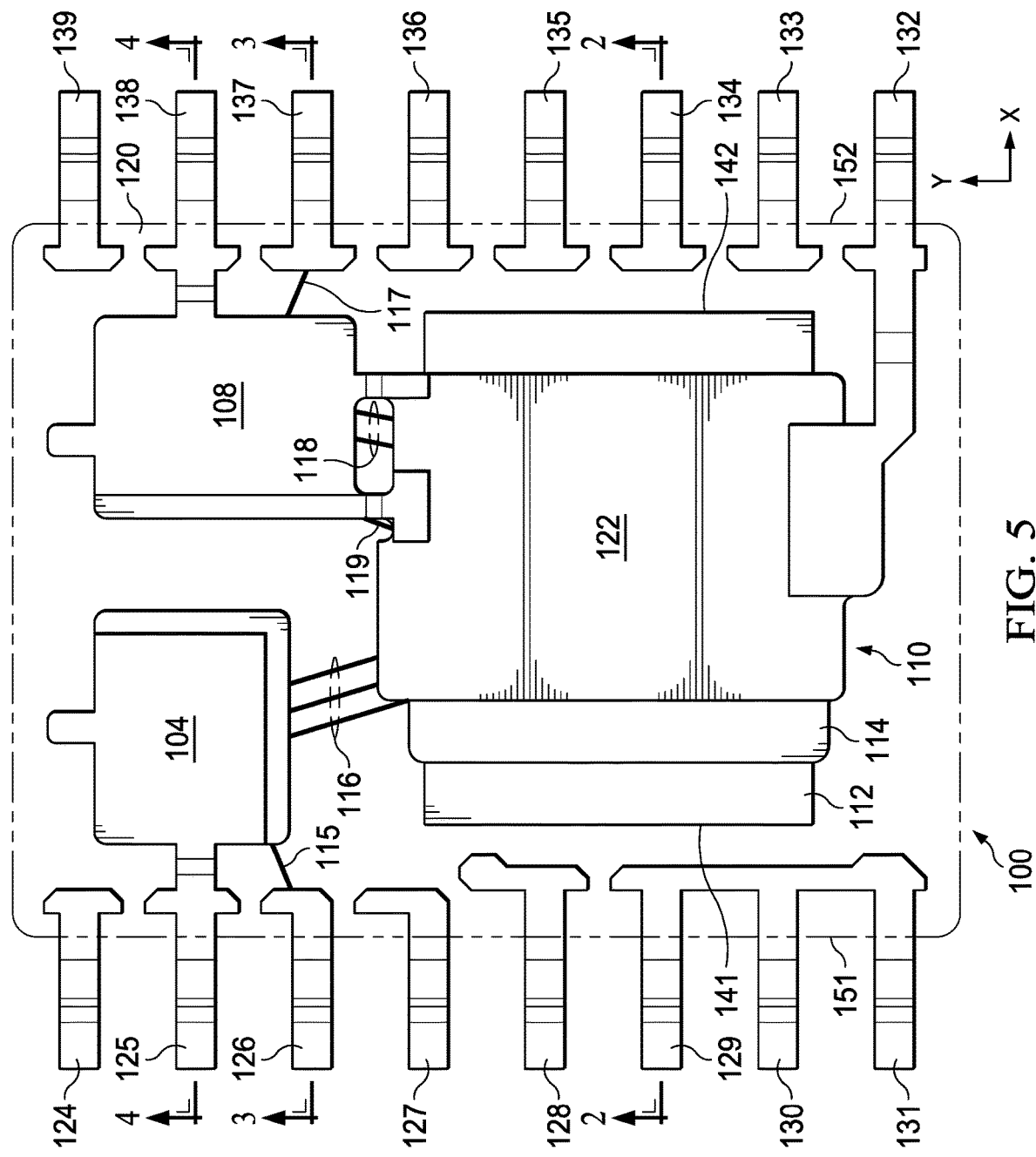
FIG. 5 is a top view of the packaged electronic device of FIGS. 1-4.
Figure 6:
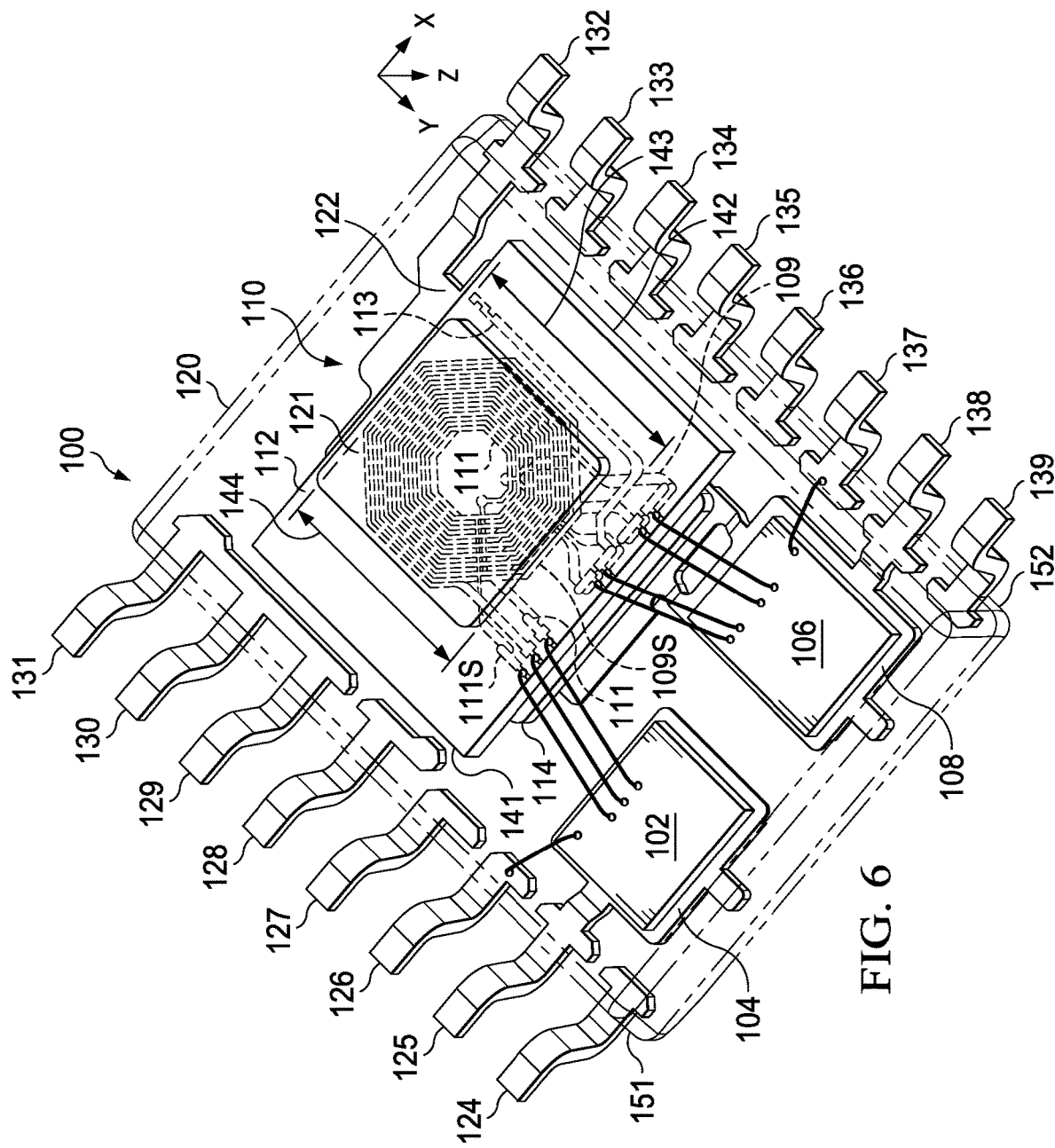
FIG. 6 is a bottom perspective view of the packaged electronic device of FIGS. 1-5.

The example device 100 provides an asymmetrically located magnetic assembly that facilitates reduced electric field levels and enhanced high voltage withstand ratings without adversely affecting mold material flow during fabrication, and provides a cost-effective scalable solution to the above-described problems. FIG. 1 shows a bottom view of the example device 100, and FIGS. 2-4 show partial sectional and elevation views along the respective lines 2-2, 3-3, and 4-4 in FIG. 1. FIG. 5 shows a top view, and FIG. 6 shows a bottom perspective view of the packaged electronic device 100. The example electronic device 100 has a small outline integrated circuit (SOIC) package type with gull wing leads on opposite sides. Other packaged electronic devices can be provided in different implementations, including conductive features that can be soldered to another structure or structures for electrical interconnections, such as so called leadless package types (e.g., flat no-leads packages such as quad-flat no-leads (QFN), dual-flat no-leads (DFN), micro lead frame (MLF) and small-outline no leads (SON) types with planar conductive leads such as perimeter lands on the package bottom and/or side that provide electrical connections to a printed circuit board (PCB). In other examples, the device 100 includes a ball grid array (BGA) package or a land grid array (LGA) type, such as a mold array process ball grid array (MAPBGA) or an over-molded BGA (e.g. plastic BGA or PBGA). In addition, the example device 100 of FIGS. 1-6 provides electrical interconnections for first and second electrical circuits, some or all of which are implemented using bond wires. In other implementations, different forms of interconnection types can be used, including substrate based interconnections (BGA, LGA, etc.), and which a substrate includes electrical interconnections and signal routing structures (e.g., copper or aluminum traces on one or more layers or levels) alone or in combination with bond wire electrical connections. As shown in FIG. 1, the example device 100 includes conductive features (e.g., conductive die attach pads or supports) for mounting and supporting first and second semiconductor dies and a laminated magnetic assembly. The die attach pads and device leads can include any suitable conductive structures, such as copper, aluminum, etc. The example device 100 in FIG. 1 includes a first semiconductor die 102 attached to a first conductive die attach pad 104 of the lead frame assembly. The device 100 also includes a second semiconductor die 106 attached to a second conductive die attach pad 108.

The electronic device 100 includes a first circuit associated with a first voltage domain (e.g., a high voltage primary circuit of an integrated power device) as well as a second circuit associated with a second voltage domain (e.g., an isolated lower voltage secondary circuit). The second circuit in this example includes a secondary winding formed by a second patterned conductive feature 109 (also referred to as a second winding) of a magnetic assembly 110. The laminated magnetic assembly 110 includes a first patterned conductive feature 111 (also referred to as a first winding) in a multilevel lamination structure 112. In the illustrated example, the multilevel lamination structure 112 includes multiple conductive features that form primary and secondary windings of a transformer. The multilevel lamination structure 112 includes a first patterned conductive feature 111 with multiple turns in a first level (e.g., FIGS. 16-18 below) to form the first winding (e.g., a primary winding of an isolation transformer). The multilevel lamination structure 112 includes a second patterned conductive feature 109 having multiple turns in a different level to form a second winding (e.g., a transformer secondary winding).

The multilevel lamination structure 112 also includes a conductive guard trace 113 spaced apart from the first patterned conductive feature 111. The conductive guard trace 113 is positioned between an outermost turn of the first conductive feature 111 and a side of the device 100 associated with the second voltage domain. This helps keep high electric fields associated with the first and second domain voltage differences between the first (e.g., primary) winding and the leads of the second (e.g., secondary) circuit inside the lamination structure 112. The example multilevel lamination structure 112 includes a first conductive shield trace 111S with multiple turns in a second level between the first patterned conductive feature 111 and the second patterned conductive feature 109. In another example, the first conductive shield trace 111S is omitted. The example multilevel lamination structure 112 includes a second conductive shield trace 109S with multiple turns in another level between the first patterned conductive feature 111 and the second patterned conductive feature 109. In the example of FIGS. 1-6, the second conductive shield trace 109S is coupled to the conductive guard trace 113 in the second circuit. In another example, the second conductive shield trace 109S is omitted.

The magnetic assembly 110 also includes one or more core structures to facilitate forming a magnetic circuit in combination with the patterned conductive feature 111. The illustrated example includes a first (lower or bottom) core structure 114 as seen in FIGS. 1, 2, 5 and 6. The first core structure 114 is attached to a first side of the lamination structure 112. The electronic device 100 includes electrical connections such as bond wires 115, 116, 117, 118, and 119 that form electrical interconnections between certain components and leads. The packaged electronic device 100 also includes a package structure 120 that encloses the conductive die attach pads 104 and 108, the semiconductor dies 102 and 106, the magnetic assembly 110, and all or portions of conductive leads of the device 100. In one example, the package structure 120 is or includes a molded material, such as plastic. In another example, the package structure 120 is or includes a ceramic material. The magnetic assembly 110 also includes a second (upper or top) core structure 121 (seen in FIGS. 1, 2, 5 and 6). The first core structure 114 is attached to a first side of the lamination structure 112, and the second core structure 121 is attached to a second side of the lamination structure 112. In one example, the first magnetic core structure 114 is the same size as the second core structure 121. In another example, the first magnetic core structure 114 is larger than the second core structure 121. In another example, the first magnetic core structure 114 is smaller than the second core structure 121. In one example, one or both magnetic core structures 114 and 121 are pre-fabricated magnetic cores attached using epoxy paste. In another example, one or both magnetic core structures 114 and 121 are fabricated using a thick layer of magnetic paste. The laminated magnetic assembly 110 is attached to a support structure 122 that is integral to the second conductive die attach pad 108. In another implementation, the magnetic assembly 110 is mounted to a support structure (not shown) that is separated and spaced apart from the first and second die attach pads 104 and 108.

In this example, a first set of electrical connections is a first set of bond wires 115 and 116 that couple the first conductive shield trace 111S (if included), the first semiconductor die 102, the first patterned conductive feature 111, and at least one of first conductive leads 124-131 in a first (e.g., high voltage primary) circuit of the device 100. As best shown in FIG. 1, the first conductive die attach pad 104 is directly coupled to a single first lead 125. In other examples, the die attach pad 104 is directly coupled to multiple conductive first leads. In the example device 100, the die attach pad 104 and the lead 125 are a single continuous metal structure, such as copper or aluminum. A first bond wire 115 couples a conductive feature (e.g., bond pad) of the first semiconductor die 102 to the first lead 126, and bond wires 116 couple further bond pads of the first semiconductor die 102 to first and second ends of the first patterned conductive feature 111, and also couple the first semiconductor die 102 to the first conductive shield trace 111S.

A second set of electrical connections in this example is a second set of bond wires 117, 118 and 119 that couple the second conductive shield trace 109S (if included), the second semiconductor die 106, the second patterned conductive feature 109, the conductive guard trace 113, and at least one of second conductive leads 132-139 in a second circuit (e.g., a lower voltage secondary circuit) that is isolated from the first circuit. The second conductive die attach pad 108 is directly coupled to a single lead 138, and the connected support structure 122 is directly connected to a single lead 132. In other examples, the second die attach pad 108 and/or the support structure 122 is/are directly coupled to multiple conductive leads. In the example device 100, the second die attach pad 108, the support structure 122, and the leads 132 and 138 are a single continuous metal structure, such as copper or aluminum. A bond wire 117 couples a bond pad of the second semiconductor die 106 to the second lead 137, and bond wires 118 couple further bond pads of the second semiconductor die 106 to first and second ends of the second patterned conductive feature. In addition, bond wires 119 couple the second semiconductor die 106 to the second conductive shield trace 109S and to the conductive guard trace 113.

As best shown in FIGS. 2-4 and 6, the package structure 120 encloses the die attach pads 104 and 108, and the associated support structure 122. In addition, the package structure 120 encloses inner portions of the conductive leads 124-139. The conductive leads 124-139 in one example are so-called gull wing leads that extend downward and outward from the package structure 120 as shown in FIGS. 2-4 and 6. Different types and shapes of conductive leads can be used in other examples (e.g., J leads). FIGS. 2-4 show respective sectional views of the packaged electronic device 100 taken along lines 2-2, 3-3, and 4-4 of FIGS. 1 and 5. As best shown in FIGS. 2-4, the example package structure 120 includes a top side 211 and an opposite bottom side 212.

The multilevel lamination structure 112 has a first side 141 facing the first conductive leads 124-131, and a second side 142 facing the second conductive leads 132-139. In this orientation, the conductive guard trace 113 is spaced apart from and between the first winding formed by the first patterned conductive feature 111 and the second conductive leads 132-139. The package structure 120 has respective first and second sides 151 and 152 spaced apart from one another along a first direction (e.g., the X direction in FIGS. 1-6). The first conductive leads 124-131 are located along, and extend outward from, the first side 151 of the package structure 120, and the second conductive leads 132-139 are located along, and extend outward from, the second side 152 of the package structure 120. The conductive guard trace 113 spaced apart from and between the first patterned conductive feature 111 and the second side 152 of the package structure 120.

As shown in FIGS. 1 and 6, the conductive guard trace 113 has a length 143 along a perpendicular second direction (e.g., the Y direction in FIGS. 1-6), and an outermost turn of the first patterned conductive feature 111 has a length 144 along the second direction. In the illustrated example, the guard trace length 143 is greater than the Y-direction winding length 144, although not a strict requirement of all possible implementations. In this implementation, moreover, the ends of the conductive guard trace 113 extend in the Y-direction outward beyond the Y-direction ends of the outermost turn of the first patterned conductive feature 111. The conductive guard trace 113 in the illustrated example is spaced along the X direction from the second side 142 of the multilevel lamination structure 112, although not a strict requirement of all possible implementations. In one example, The X-direction spacing between the conductive guard trace 113 and the outermost turn of the first patterned conductive feature 111 is designed according to the dielectric material properties of the multilevel lamination structure 112 and the expected rated voltage difference between the first and second circuits (e.g., between the transformer primary and secondary windings) and any associated voltage withstand performance specifications for the electronic device 100.

In operation of the electronic device 100, the voltage of the first patterned conductive feature 111 can be much higher than the voltage of the second conductive leads 132-139 along the second side 152 of the package structure 120. Interior portions of the second conductive leads 132-139 are enclosed by the molding compound or ceramic material of the package structure 120, which has a lower dielectric constant than that of the lamination layers or levels of the multilevel lamination structure 112. Moreover, the external portions of the second conductive leads 132-139 are exposed to ambient air, which has a lower dielectric constant than those of the package structure 120 and the multilevel lamination structure 112. The longer length and positioning of the conductive guard trace 113 within the multilevel lamination structure 112 helps keep the high electric field in the high dielectric material of the multilevel lamination structure 112 to mitigate or avoid arcing during production testing and normal operation of the packaged electronic device 100.

Figure 7:
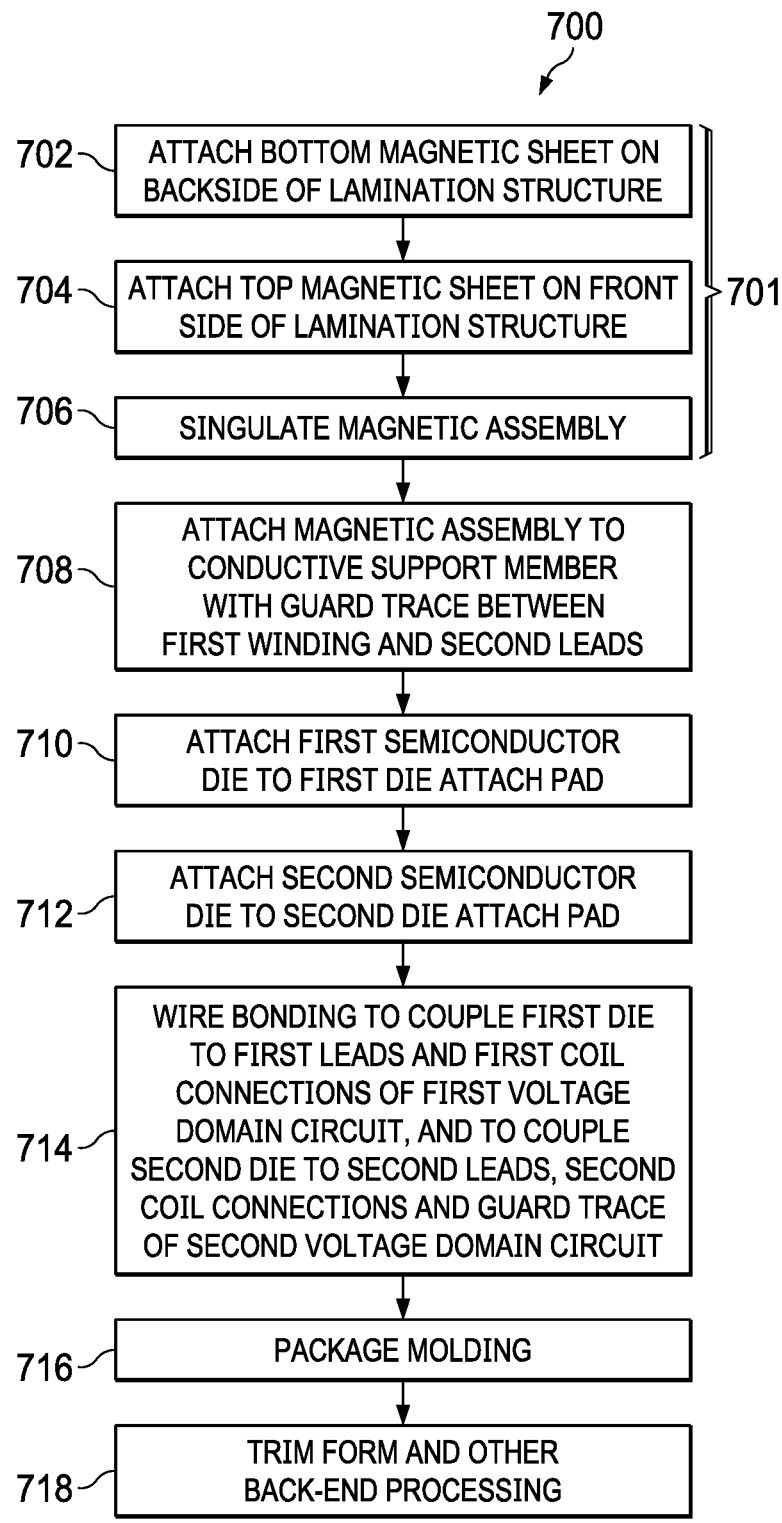
FIG. 7 is a flow diagram of a method of fabricating an electronic device.
Figure 8:
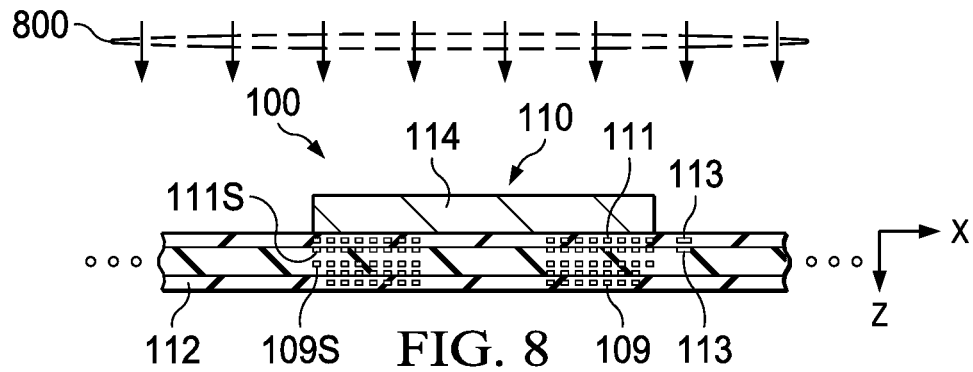
FIGS. 8-13 are partial sectional end elevation views of the packaged electronic device of FIGS. 1-6 undergoing fabrication according to the method of FIG. 7.

Referring now to FIGS. 7-13, FIG. 7 shows a method 700 for fabricating a packaged electronic device, such as the device 100 of FIGS. 1-6. FIGS. 8-13 show the example packaged electronic device 100 undergoing fabrication according to the method 700. The method 700 includes fabricating a laminated magnetic assembly with a conductive guard trace at 701. In certain implementations, the magnetic assembly is separately assembled and provided as an input to the method 700. In the illustrated example, the magnetic assembly at 701 includes attaching a bottom magnetic core (e.g., sheet) on a back side of a multilevel lamination structure at 702. FIG. 8 shows one example, in which an attachment process 800 is performed that attaches the first (lower or bottom) core structure 114 to a bottom side of the example multilevel lamination structure 112. The multilevel lamination structure 112 can be any suitable multi-layer lamination with patterned conductive features 109 and 111, such as transformer windings, and a conductive guard trace 113. The patterned conductive features 109, 111 and 113 can be created by any suitable processing, such as screen printing conductive material onto a laminate layer. The multilevel lamination structure 112 can include one or more bonding steps to bond laminate layers or sheets to one another to form the lamination structure 112. The core structure 114 in one example is a magnetic sheet structure, although not required of all possible implementations. The attachment process 800 can include deposition of an epoxy or other adhesive onto the bottom surface of the multilevel lamination structure 112 and/or onto the surface of the core structure 114. The adhesive in one example is printed magnetic ink epoxy, although non-magnetic adhesives can be used in other examples. The attachment process 800 also includes bringing the core structure 114 into contact with the bottom side of the multilevel lamination structure 112 and/or into contact with the epoxy formed thereon. The attachment process 800 in one example also includes any necessary curing steps (e.g., thermal, optical, ultraviolet (UV), etc.).

Figure 9:
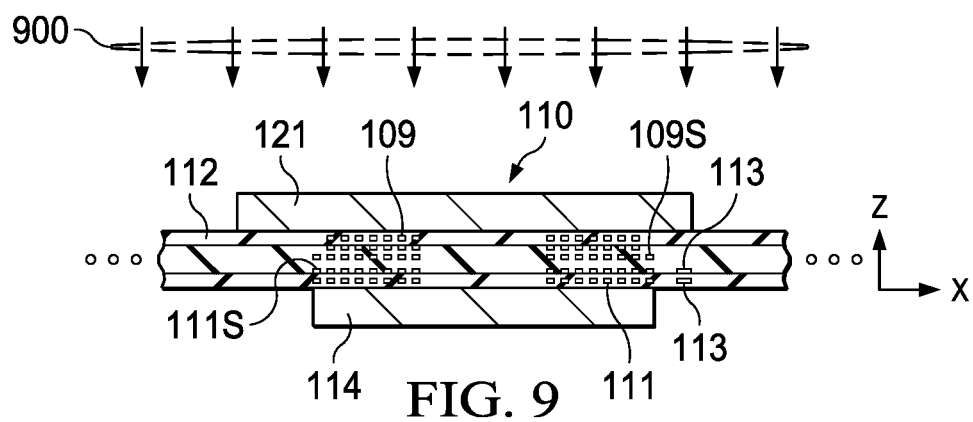

The method 700 continues at 704 with attaching a top magnetic core (e.g., sheet) on the front side of the lamination structure. FIG. 9 shows one example, in which a second attachment process 900 is performed that attaches the second (upper or top) core structure 121 to a second side of the lamination structure 112. The attachment process 900 can be the same or similar process as the first attachment process 800 used to attach the first core structure 114 to the lamination structure 112. The respective upper and lower core structures 121 and 114 are attached to the multilevel lamination structure 112 by epoxy or other suitable attachment structures and/or techniques to form a magnetically coupled transformer apparatus. In other examples, one of the upper or lower core structures 121 or 114 can be omitted, with the remaining core structure providing magnetic coupling for the transformer of the device 100.

Figure 10:
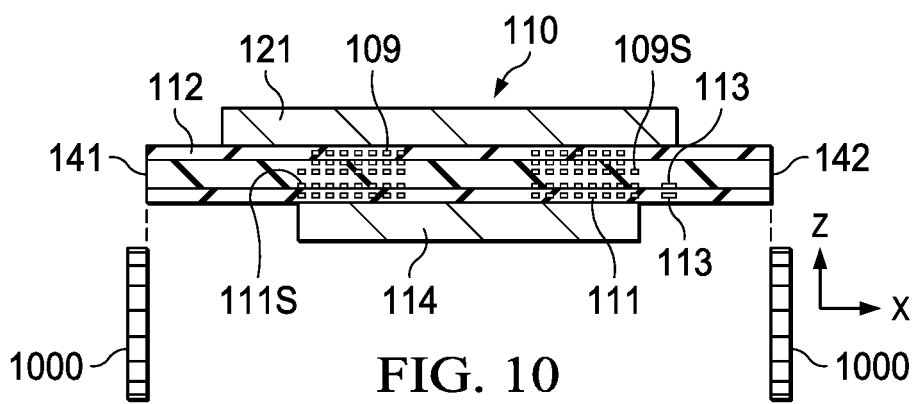

The method 700 further includes separating (e.g., singulating) the magnetic assembly at 706. In one example, the magnetic assembly process is used to concurrently fabricate multiple laminated magnetic assemblies, such as using a single large multilevel lamination structure 112, and attachment of one or more core structures 114, 121 to opposite sides thereof. FIG. 10 shows one example in which such a large lamination structure 112 is diced or cut to singulate or separate individual laminated magnetic assemblies 110 from the initial unitary structure. A singulation process 1000 is performed in the example of FIG. 10, which singulates or separates multiple laminated magnetic assemblies 110 from a starting unitary structure, for example, using a saw blade, etching, laser cutting, etc.

Figure 11:
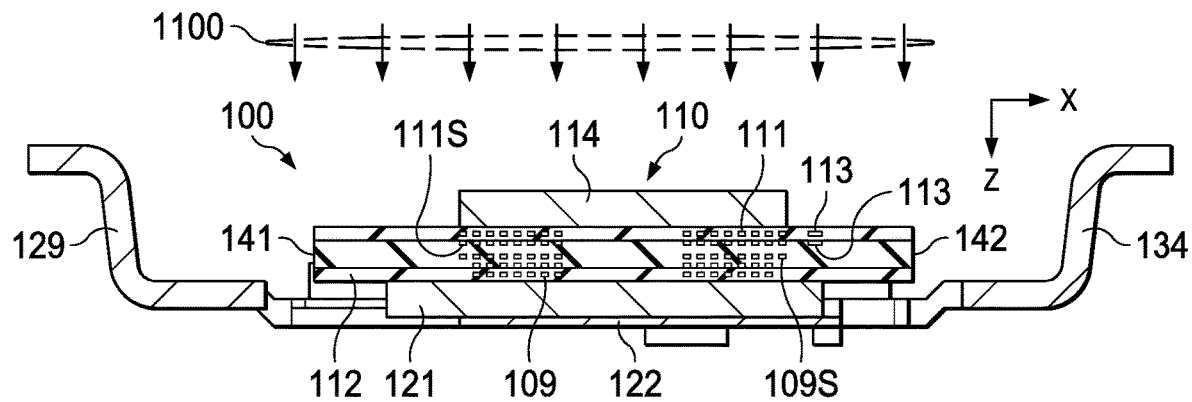

At 708, the magnetic assembly 110 is attached to the support structure 122. The attachment at 708 in one implementation includes attaching the magnetic assembly 110 to the support structure 122 with the first side 141 of the multilevel lamination structure 112 facing the first conductive leads 124-131, and with the second side 142 of the multilevel lamination structure 112 facing the second conductive leads 132-139. The attachment at 708 in this example also includes orienting the magnetic assembly 110 such that the conductive guard trace 113 of the multilevel lamination structure 112 is spaced apart from and between the first winding 111 of the multilevel lamination structure 112 and the second conductive leads 132-139. In one example, a lead frame structure is provided that includes conductive leads (e.g., 124-139 in FIGS. 1-6 above) and conductive die attach pads 104 and 108. In one implementation, the lead frame structure is provided on a tacky tape or other adhesive carrier, with the various constituent structures assembled in a predetermined relative arrangement to facilitate subsequent assembly steps in the method 700. FIG. 11 shows one example, in which an attachment process 1100 is performed that attaches the multilevel lamination structure 112 of the magnetic assembly 110 to a corresponding surface of the support structure 122. Any suitable attachment process 1100 can be used, such as application of adhesive, joining the components, and any necessary curing. In another example, conductive features of the multilevel lamination structure 112 can be soldered to the support structure 122 at 708.

Figure 12:
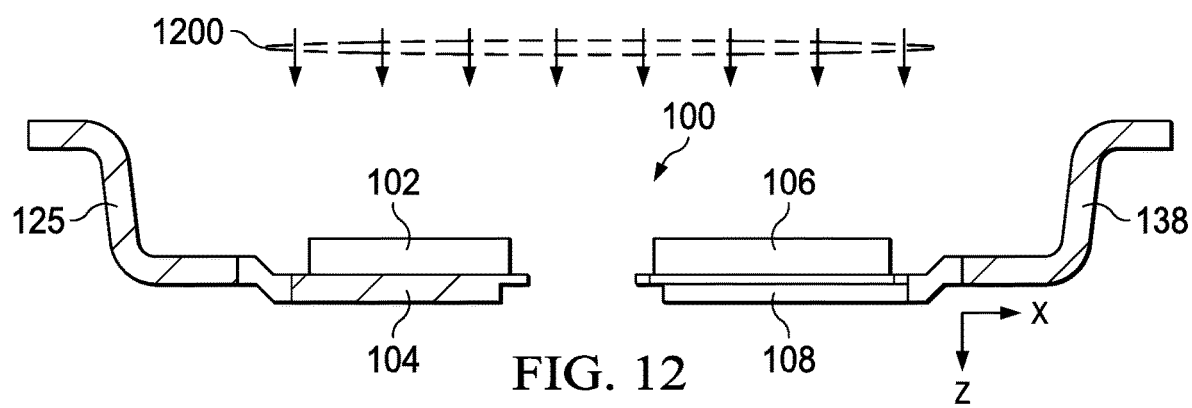

The process 700 continues at 710 and 712 in FIG. 7 with attaching semiconductor dies to corresponding die attach pads, for example, using adhesive or soldering. FIG. 12 shows one example in which a die attach process 1200 is performed that attaches the first semiconductor die 102 to the first die attach pad 104 (e.g., where the die attach pad 104 is one continuous conductive structure that includes the lead 125). At 712, the process 1200 also attaches the second semiconductor die 106 to the corresponding second die attach pad 108 (e.g., one continuous conductive structure that also includes the lead 138).

Figure 13:
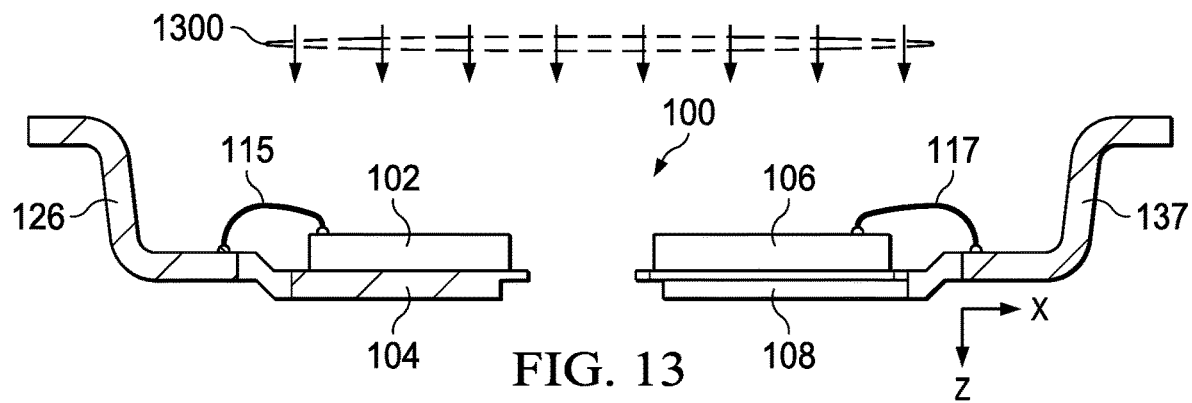

The method 700 also includes wire bonding or other electrical connection processing at 714. FIG. 13 shows one example in which a wire bonding process 1300 is performed that forms connections (e.g., bond wires 115-119 in FIGS. 1-6 above) between the semiconductor dies and one or more conductive leads and/or conductive features of the magnetic assembly 110 to form first and second circuits. In the illustrated sectional view of FIG. 13, the connection process 1300 includes forming the first bond wire connection 115 between a first conductive feature of the first semiconductor die 102 and the conductive lead 126, and forming a bond wire connection 117 between a first conductive feature of the second semiconductor die 106 and the conductive lead 137. In another example, different electrical connections are formed to create the first circuit, such as flip-chip processing to interconnect solder balls, conductive pillars, bond pads, etc. of the structures together in a first electrical circuit.

Further connections can be made at 714 for a particular design, for example, to form the bond wires 115-119 shown in FIGS. 1-6. In the illustrated example, the wire bonding process 1300 couples the first semiconductor die 102, the first winding 111 of the magnetic assembly 110, and at least one of the first conductive leads 124-131 in a first circuit, and couples the second semiconductor die 106, a second winding 109 of the magnetic assembly 110, the conductive guard trace 113, and at least one of the second conductive leads 132-139 in a second circuit isolated from the first circuit. In one example, the wire bonding process 1300 couples a first conductive shield trace (e.g., 111S in FIG. 1) of the multilevel lamination structure 112 to the first circuit. In one implementation, the wire bonding process 1300 couples a second conductive shield trace (e.g., 109S) of the multilevel lamination structure 112 to the second circuit. In one example, moreover, the wire bonding process 1300 couples the conductive guard trace 113 to the second conductive shield trace 109S of the multilevel lamination structure 112. In another example, different electrical connections are formed to create the first circuit, such as flip-chip processing to interconnect solder balls, conductive pillars, bond pads, etc. of the structures together in a second electrical circuit.

In certain examples, the wire bonding or other interconnection processing at 714 can be performed using supporting structures to provide mechanical structural support for one or more features of the magnetic assembly 110 during bond wire attachment. In one example, one or both magnetic core structures 114 and 121 can be supported with a custom bond wire clamping tool (not shown) during bond wire soldering operations. In one example, the bond wire clamping tool can include a cavity to support the laminate bond pad area that extends beyond the supported magnetic core structure.

The method 700 continues at 716 with forming the final package structure 120. In one example, the packaging at 716 includes performing a molding process (not shown) that forms the package structure 120 to enclose the dies 102 and 106, the conductive die attach pads 104 and 108, the support structure 122, the magnetic assembly 110, the electrical connections (e.g., the bond wires 115-119) and portions of the conductive leads 124-139. FIGS. 1-6 above show an example molded plastic package structure 120 formed at 716 in FIG. 7. In another example, a ceramic package structure can be formed at 716. At 718 in FIG. 7, further backend processing can be performed, such as lead forming and trimming, etc.

Figure 14:
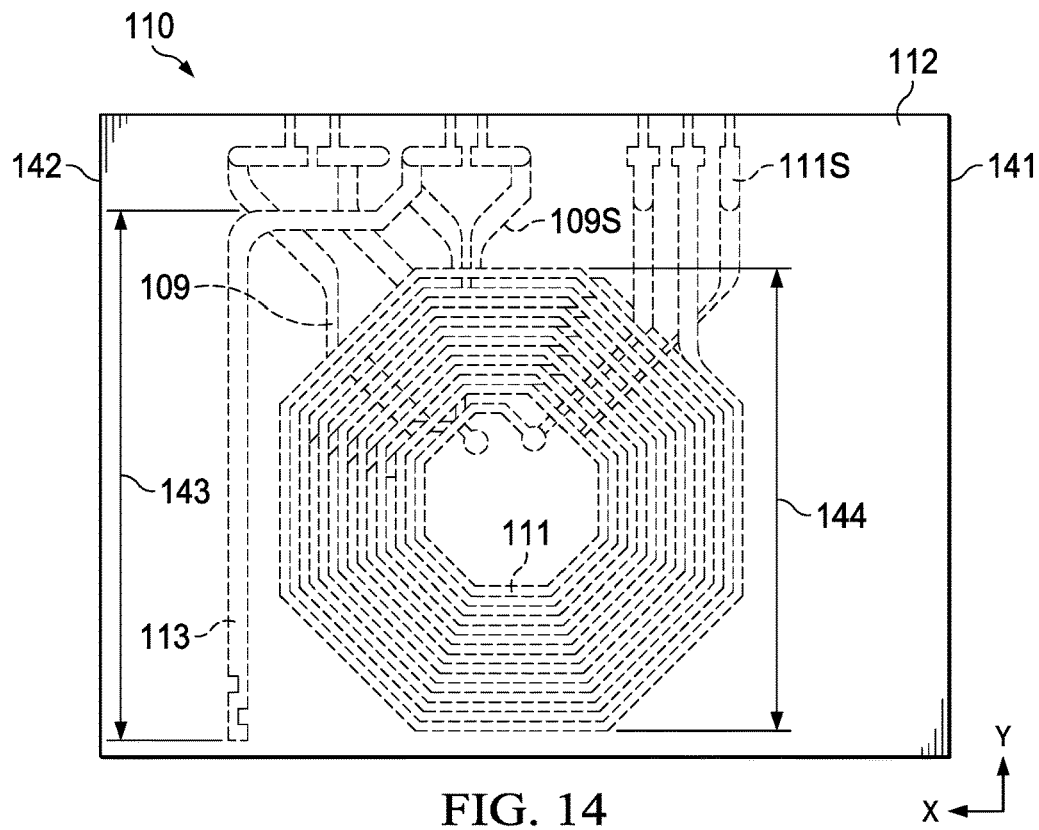
FIG. 14 is a bottom view of the multilevel lamination structure of the packaged electronic device of FIGS. 1-6 with first and second winding and a conductive guard trace.
Figure 15:
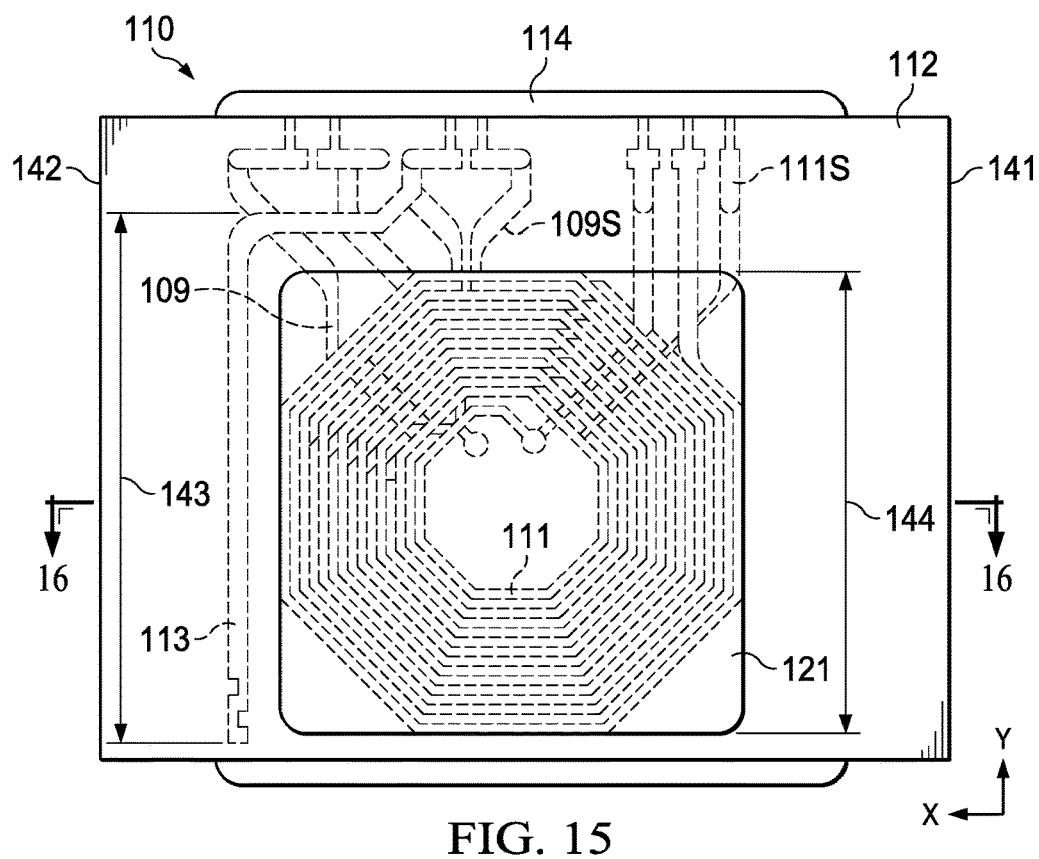
FIG. 15 is a bottom view of the magnetic assembly of the packaged electronic device of FIGS. 1-6 with the multilevel lamination structure of FIG. 14 and upper and lower cores.
Figure 16:
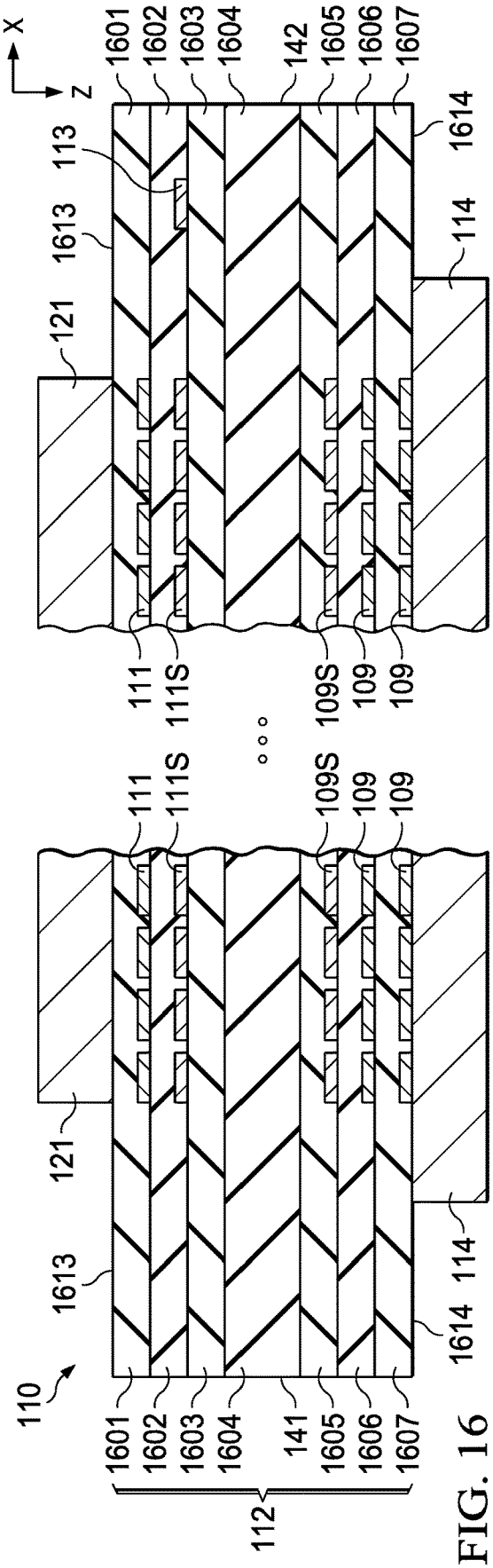
FIG. 16 is a partial sectional end view of one embodiment of the magnetic assembly taken along line 16-16 of FIG. 15.
Figure 17:
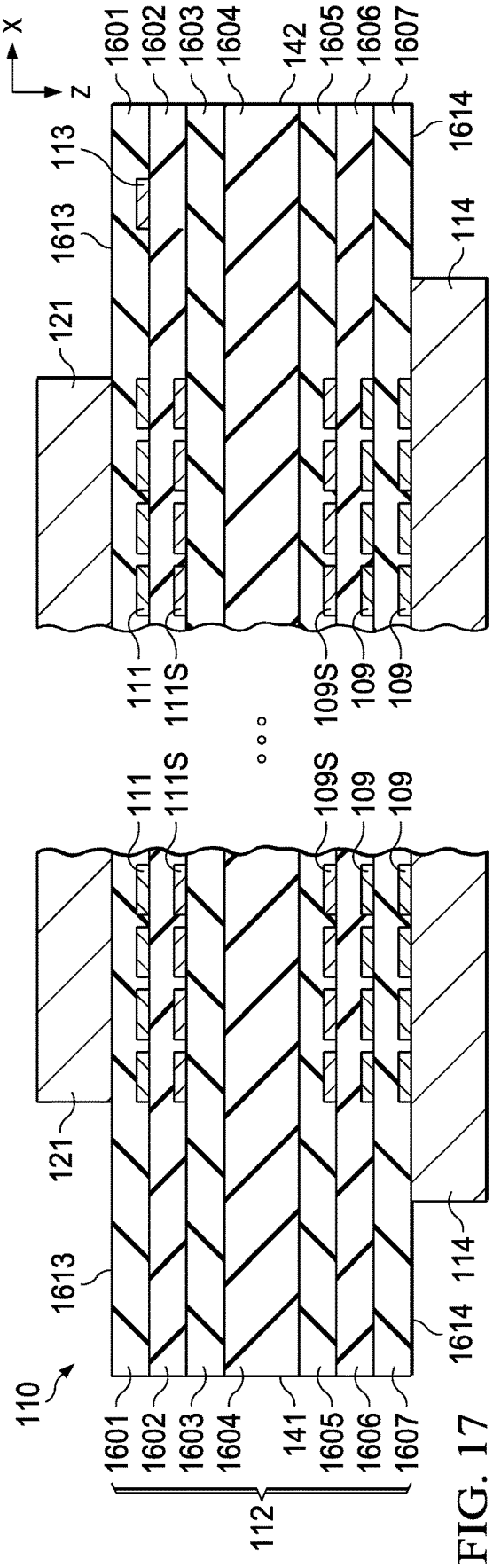
FIG. 17 is a partial sectional end view of another embodiment of the magnetic assembly taken along line 16-16 of FIG. 15.
Figure 18:
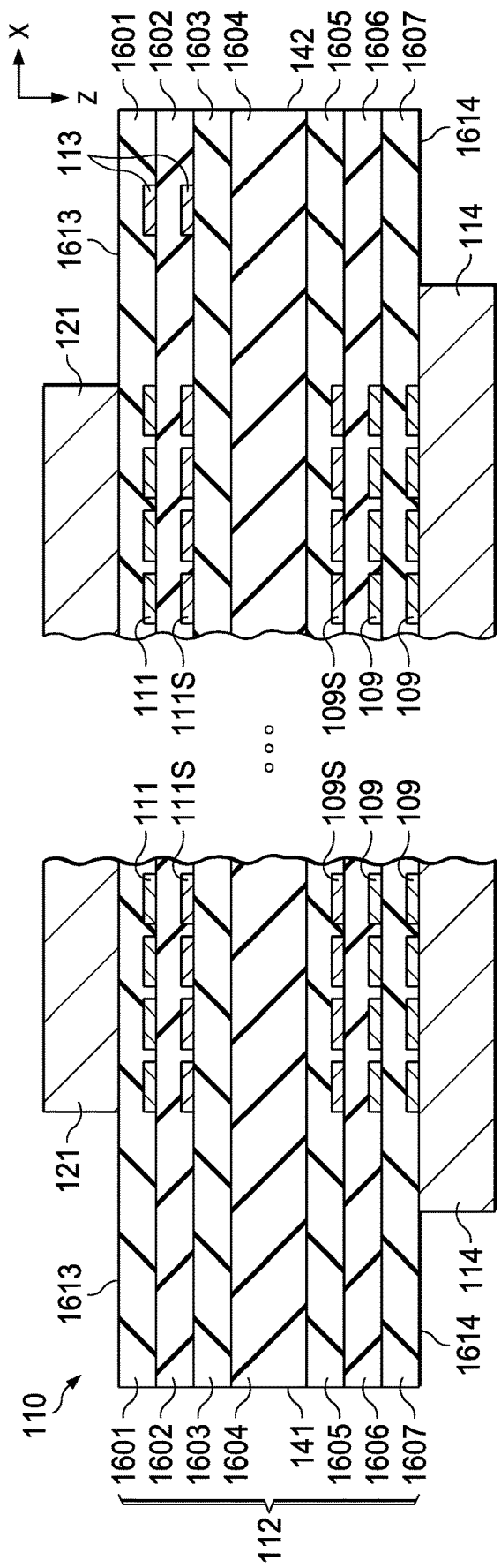
FIG. 18 is a partial sectional end view of a third embodiment of the magnetic assembly taken along line 16-16 of FIG. 15.

FIGS. 14-18 show further details of the example multilevel lamination structure 112. FIG. 14 shows a bottom view of the multilevel lamination structure 112 with first and second windings and a conductive guard trace, and FIG. 15 shows a bottom view of the magnetic assembly 110 with the multilevel lamination structure 112 and the respective upper and lower cores 114 and 121 attached. FIGS. 16-18 show partial sectional end views of three different embodiments of the magnetic assembly 110 taken along line 16-16 of FIG. 15. The multilevel lamination structure 112 is a multilayer structure with patterned conductive features 109, 109S, 111, 111S and 113 that form parts of a transformer. In one example, the first patterned conductive feature 111 forms a transformer primary winding, a second patterned conductive feature 109 forms a transformer secondary winding. In one example, further patterned conductive features form one or more second secondary windings, one or more conductive (e.g., Faraday) shields, one or more sense coils, and the conductive guard trace 113.

The patterned conductive features in one example have components on multiple levels (e.g., layers) of the multilevel lamination structure 112, although not required of all possible implementations. In one example, the patterned winding turns of the individual primary and/or secondary windings extend on different layers of the multilevel lamination structure 112, although not required of all possible implementations. The example patterned winding features include multiple turns in a spiral pattern on the individual layers of the multilevel lamination structure 112, although other implementations are possible, such as single turn winding structures on a corresponding layer. The example patterned conductive features forming the transformer windings 109 and 111, shields 109S and 111S, and the guard trace 113 include conductive end connection features allowing interconnection of the windings to pins or semiconductor dies of the device 100, such as for bond wire connections 115-119 or other conductive interconnection types (e.g., solder balls, not shown) in the packaged electronic device 100. The semiconductor dies 102 and 106 include pillars, solder bumps, conductive landing pads or other conductive features (e.g., bond pads) that can be electrically interconnected to other structures using bond wires 115-119 or through direct soldering using any suitable electrical interconnection technology (e.g., wire bonding, flip-chip attachment.

As shown in FIGS. 16-18, the multilevel lamination structure 112 has the first side 141 and the opposite second side 142 spaced from one another along the X-direction, and a Y-direction stack of levels (e.g., layers) 1601-1607. The multilevel lamination structure 112 has a third side 1613 attached to the core 121 and a fourth side 1614 attached to the core 114 and spaced apart from the third side 1613 along the Y-direction. The first patterned conductive feature 111 includes multiple turns in a first level 1601 to form the first winding, and the second patterned conductive feature 109 has multiple turns in two different levels 1606 and 1607 to form the second winding. The second conductive shield 109S in this example is formed in a fifth level 1605, and the levels 1603 and 1604 form an isolation barrier between the primary and secondary circuits. In the example of FIG. 16, the conductive guard trace 113 and the first conductive shield 111S are formed in a second level 1602, where the conductive guard trace 113 is spaced apart from and between the first patterned conductive feature 111 and the second side 142 of the multilevel lamination structure 112. FIG. 17 shows another example, in which the conductive guard trace 113 is formed in the first level 1601, spaced apart from and between the first patterned conductive feature 111 and the second side 142 of the multilevel lamination structure 112. In the example of FIG. 18, the conductive guard trace 113 is formed in the respective first and second levels 1601 and 1602, and the conductive guard trace 113 is spaced apart from and between the first patterned conductive feature 111 and the second side 142 of the multilevel lamination structure 112.

The conductive guard trace 113 reduces electrostatic fields in the area near the package leads, and facilitates high voltage screening testing at final test with a desired target acceptance threshold (e.g., 5 kVrms) reinforced isolation capability and datasheet specification of the product. The conductive guard trace 113 maintains higher electrostatic field intensity within the laminate material of the multilevel lamination structure 112, which material has a higher dielectric strength compared to the leaded package mold compound material of the package structure 120 and the air near the package external surface that has lower dielectric strength. The described examples provide an integrated solution for high voltage withstand performance and testing capability within the package structure 120 using a unique laminate design feature, with no additional cost or change in package footprint. Moreover, the solution is independent of silicon manufacturing process nodes and is independent of end user circuit board design.

Modifications are possible in the described embodiments, and other embodiments are possible, within the scope of the claims.

The following is claimed:

1. A packaged electronic device, comprising:
   first conductive leads along a first side of a package structure;
   second conductive leads along a second side of the package structure;
   a first semiconductor die attached to a first die attach pad;
   a second semiconductor die attached to a second die attach pad;
   a magnetic assembly attached to a support structure in the package structure, the magnetic assembly including:
     a multilevel lamination structure, including: a first patterned conductive feature having multiple turns in a first level to form a first winding, a second patterned conductive feature having multiple turns in a different level to form a second winding, and a conductive guard trace spaced apart from and between the first patterned conductive feature and the second side of the package structure;
     a first core structure attached to a first side of the multilevel lamination structure; and
     a second core structure attached to a second side of the multilevel lamination structure;
   a first set of electrical connections that couple the first semiconductor die, the first patterned conductive feature, and at least one of the first conductive leads in a first circuit; and
   a second set of electrical connections that couple the second semiconductor die, the second patterned conductive feature, the conductive guard trace, and at least one of the second conductive leads in a second circuit isolated from the first circuit.

2. The packaged electronic device of claim 1, wherein the multilevel lamination structure includes a first conductive shield trace having multiple turns in a second level between the first patterned conductive feature and the second patterned conductive feature, the first set of electrical connections coupling the first conductive shield trace to the first circuit.

3. The packaged electronic device of claim 2, wherein the conductive guard trace is in the second level.

4. The packaged electronic device of claim 2, wherein the conductive guard trace is in at least one of the first level and the second level.

5. The packaged electronic device of claim 4, wherein the multilevel lamination structure includes a second conductive shield trace having multiple turns in another level between the first patterned conductive feature and the second patterned conductive feature, the second conductive shield trace being coupled to the conductive guard trace in the second circuit.

6. The packaged electronic device of claim 4, wherein:
   the first and second sides of the package structure are spaced apart from one another along a first direction;

an outermost turn of the first patterned conductive feature has a first length along a second direction, the second direction being perpendicular to the first direction; and the conductive guard trace has a second length along the second direction, the second length being greater than the first length.

7. The packaged electronic device of claim 2, wherein:

the first and second sides of the package structure are spaced apart from one another along a first direction;

an outermost turn of the first patterned conductive feature has a first length along a second direction, the second direction being perpendicular to the first direction; and the conductive guard trace has a second length along the second direction, the second length being greater than the first length.

8. The packaged electronic device of claim 1, wherein:

the first and second sides of the package structure are spaced apart from one another along a first direction;

an outermost turn of the first patterned conductive feature has a first length along a second direction, the second direction being perpendicular to the first direction; and the conductive guard trace has a second length along the second direction, the second length being greater than the first length.

9. A magnetic assembly, comprising:

a multilevel lamination structure, including:
 a first side;
 a second side spaced apart from the first side along a first direction;
 a third side;
 a fourth side spaced apart from the third side along a second direction, the second direction being perpendicular to the first direction;
 a first patterned conductive feature having multiple turns in a first level to form a first winding;
 a second patterned conductive feature having multiple turns in a different level to form a second winding; and
 a conductive guard trace spaced apart from and between the first patterned conductive feature and the second side of the multilevel lamination structure;

a first core structure attached to the first side of the multilevel lamination structure; and a second core structure attached to the second side of the multilevel lamination structure.

10. The magnetic assembly of claim 9, wherein the multilevel lamination structure includes a first conductive shield trace having multiple turns in a second level between the first patterned conductive feature and the second patterned conductive feature.

11. The magnetic assembly of claim 10, wherein the conductive guard trace is in the second level.

12. The magnetic assembly of claim 10, wherein the conductive guard trace is in at least one of the first level and the second level.

13. The magnetic assembly of claim 12, wherein the multilevel lamination structure includes a second conductive shield trace having multiple turns in another level between the first patterned conductive feature and the second patterned conductive feature.

14. The magnetic assembly of claim 12, wherein:

an outermost turn of the first patterned conductive feature has a first length along the second direction; and the conductive guard trace has a second length along the second direction, the second length being greater than the first length.

15. The magnetic assembly of claim 10, wherein:

an outermost turn of the first patterned conductive feature has a first length along the second direction; and the conductive guard trace has a second length along the second direction, the second length being greater than the first length.

16. The magnetic assembly of claim 9, wherein:

an outermost turn of the first patterned conductive feature has a first length along the second direction; and the conductive guard trace has a second length along the second direction, the second length being greater than the first length.

17. A packaged electronic device, comprising:

first conductive leads along a first side of a package structure;

second conductive leads along a second side of the package structure;

a first semiconductor die attached to a first die attach pad;

a second semiconductor die attached to a second die attach pad;

a magnetic assembly attached to a support structure in the package structure, the magnetic assembly including:
 a multilevel lamination structure, including: a first patterned conductive feature having multiple turns in a first level to form a first winding, a second patterned conductive feature having multiple turns in a different level to form a second winding, and a conductive guard trace spaced apart from and between the first patterned conductive feature and the second side of the package structure;

a first set of electrical connections that couple the first semiconductor die, the first patterned conductive feature, and at least one of the first conductive leads in a first circuit; and a second set of electrical connections that couple the second semiconductor die, the second patterned conductive feature, the conductive guard trace, and at least one of the second conductive leads in a second circuit isolated from the first circuit.

18. The packaged electronic device of claim 17, further including a core structure attached to a side of the multilevel lamination structure adjacent the first patterned conductive feature.

19. The packaged electronic device of claim 17, further including a core structure attached to a side of the multilevel lamination structure adjacent the second patterned conductive feature.

20. A multilevel lamination structure, comprising:

a first side;

a second side spaced apart from the first side along a first direction;

a third side;

a fourth side spaced apart from the third side along a second direction, the second direction being perpendicular to the first direction;

a first patterned conductive feature having multiple turns in a first level to form a first winding;

a second patterned conductive feature having multiple turns in a different level to form a second winding; and a conductive guard trace spaced apart from and between the first patterned conductive feature and the second side of the multilevel lamination structure.

21. The multilevel lamination structure of claim 20, further including a first core structure attached to the third side of the multilevel lamination structure.

22. The multilevel lamination structure of claim 21, further including a second core structure attached to the fourth side of the multilevel lamination structure.

23. The multilevel lamination structure of claim 20, wherein the multilevel lamination structure includes a first conductive shield trace having multiple turns in a second level between the first patterned conductive feature and the second patterned conductive feature.

24. The multilevel lamination structure of claim 23, wherein the conductive guard trace is in the second level.

25. The multilevel lamination structure of claim 24, wherein:
- an outermost turn of the first patterned conductive feature has a first length along the second direction; and
- the conductive guard trace has a second length along the second direction, the second length being greater than the first length.

26. The multilevel lamination structure of claim 23, wherein the conductive guard trace is in at least one of the first level and the second level.

27. The multilevel lamination structure of claim 26, wherein the multilevel lamination structure includes a second conductive shield trace having multiple turns in another level between the first patterned conductive feature and the second patterned conductive feature.

28. The multilevel lamination structure of claim 26, wherein:
- an outermost turn of the first patterned conductive feature has a first length along the second direction; and
- the conductive guard trace has a second length along the second direction, the second length being greater than the first length.

29. The multilevel lamination structure of claim 23, wherein:
- an outermost turn of the first patterned conductive feature has a first length along the second direction; and
- the conductive guard trace has a second length along the second direction, the second length being greater than the first length.

* * * * *